(12) United States Patent
Anderson et al.

(10) Patent No.: US 8,513,743 B2
(45) Date of Patent: Aug. 20, 2013

(54) FIELD EFFECT TRANSISTOR WITH CHANNEL REGION HAVING PORTIONS WITH DIFFERENT BAND STRUCTURES FOR SUPPRESSED CORNER LEAKAGE

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/615,940

(22) Filed: Sep. 14, 2012

(65) Prior Publication Data

US 2013/0009255 A1 Jan. 10, 2013

Related U.S. Application Data

(62) Division of application No. 13/362,019, filed on Jan. 31, 2012, now Pat. No. 8,350,343, which is a division of application No. 12/190,041, filed on Aug. 12, 2008, now Pat. No. 8,125,037.

(51) Int. Cl.
 *H01L 29/76* (2006.01)

(52) U.S. Cl.
 USPC .... 257/410; 257/372; 257/374; 257/E21.459; 257/E29.255

(58) Field of Classification Search
 USPC .......... 257/372, 374, 410, E21.459, E29.255
 See application file for complete search history.

(56) References Cited

U.S. PATENT DOCUMENTS

| | | | |
|---|---|---|---|
| 6,084,276 A | 7/2000 | Gambino et al. | |
| 6,097,069 A | 8/2000 | Brown et al. | |
| 6,100,143 A | 8/2000 | Brown et al. | |
| 6,297,530 B1 * | 10/2001 | Akatsu et al. | 257/327 |
| 6,339,232 B1 | 1/2002 | Takagi | |
| 6,358,799 B2 | 3/2002 | Odanaka et al. | |
| 6,495,424 B2 | 12/2002 | Kunikiyo | |
| 6,498,085 B2 | 12/2002 | Jung et al. | |
| 6,605,520 B2 | 8/2003 | Cheong | |
| 6,613,635 B2 | 9/2003 | Oda et al. | |
| 6,924,536 B2 | 8/2005 | Nishiyama et al. | |
| 6,974,998 B1 | 12/2005 | Liu et al. | |
| 7,275,233 B2 | 9/2007 | McElvain et al. | |
| 7,291,528 B2 | 11/2007 | Chen et al. | |
| 7,659,537 B2 | 2/2010 | Tezuka et al. | |
| 2001/0041421 A1 | 11/2001 | Park et al. | |
| 2002/0037619 A1 | 3/2002 | Sugihara et al. | |

(Continued)

OTHER PUBLICATIONS

U.S. Appl. No. 12/190,028, filed Aug. 12, 2008, Office Action Communication, Mar. 8, 2010, 19 pages.

(Continued)

*Primary Examiner* — Andy Huynh

(74) *Attorney, Agent, or Firm* — Gibb & Riley, LLC; Anthony J. Canale

(57) ABSTRACT

Disclosed are embodiments of field effect transistors (FETs) having suppressed sub-threshold corner leakage, as a function of channel material band-edge modulation. Specifically, the FET channel region is formed with different materials at the edges as compared to the center. Different materials with different band structures and specific locations of those materials are selected in order to effectively raise the threshold voltage (Vt) at the edges of the channel region relative to the Vt at the center of the channel region and, thereby to suppress of sub-threshold corner leakage. Also disclosed are design structures for such FETs and method embodiments for forming such FETs.

19 Claims, 11 Drawing Sheets

(56) References Cited

U.S. PATENT DOCUMENTS

| | | |
|---|---|---|
| 2002/0187616 A1 | 12/2002 | Lai et al. |
| 2003/0094637 A1 | 5/2003 | Awano |
| 2004/0207024 A1 | 10/2004 | Eikyu |
| 2005/0048703 A1 | 3/2005 | Dennard et al. |
| 2005/0227452 A1 | 10/2005 | Ohashi et al. |
| 2005/0269595 A1 | 12/2005 | Tezuka |
| 2006/0079068 A1 | 4/2006 | Sheu et al. |
| 2006/0086987 A1 | 4/2006 | Chen et al. |
| 2006/0141796 A1 | 6/2006 | Kim et al. |
| 2006/0197158 A1 | 9/2006 | Babcock et al. |
| 2006/0252238 A1 | 11/2006 | Li |
| 2007/0018205 A1 | 1/2007 | Chidambarrao et al. |
| 2007/0059897 A1 | 3/2007 | Tilke et al. |
| 2007/0108526 A1 | 5/2007 | Kohyama |
| 2007/0254461 A1 | 11/2007 | Wei et al. |
| 2008/0003825 A1 | 1/2008 | Stejskal et al. |
| 2008/0006884 A1 | 1/2008 | Yagishita |
| 2008/0044981 A1 | 2/2008 | Jee et al. |
| 2008/0057635 A1 | 3/2008 | Chen |
| 2010/0013021 A1 | 1/2010 | Chen et al. |
| 2010/0044801 A1 | 2/2010 | Anderson et al. |

OTHER PUBLICATIONS

U.S. Appl. No. 12/190,028, filed Aug. 12, 2008, Office Action Communication, Jun. 15, 2010, 3 pages.

U.S. Appl. No. 12/190,028, filed Aug. 12, 2008, Notice of Allowance Communication, Jul. 14, 2010, 6 pages.

U.S. Appl. No. 12/190,041, filed Aug. 12, 2008, Office Action Communication, Dec. 30, 2010, 19 pages.

U.S. Appl. No. 12/190,041, filed Aug. 12, 2008, Office Action Communication, Jun. 7, 2011, 9 pages.

U.S. Appl. No. 12/190,041, filed Aug. 12, 2008, Notice of Allowance Communication, Oct. 24, 2011, 8 pages.

U.S. Appl. No. 13/362,019, filed Jan. 31, 2012, Office Action Communication, May 15, 2012, 7 pages.

U.S. Appl. No. 13/362,019, filed Jan. 31, 2012, Office Action Communication, Jun. 14, 2012, 14 pages.

U.S. Appl. No. 13/362,019, filed Jan. 31, 2012, Notice of Allowance Communication, Aug. 23, 2012, 7 pages.

* cited by examiner

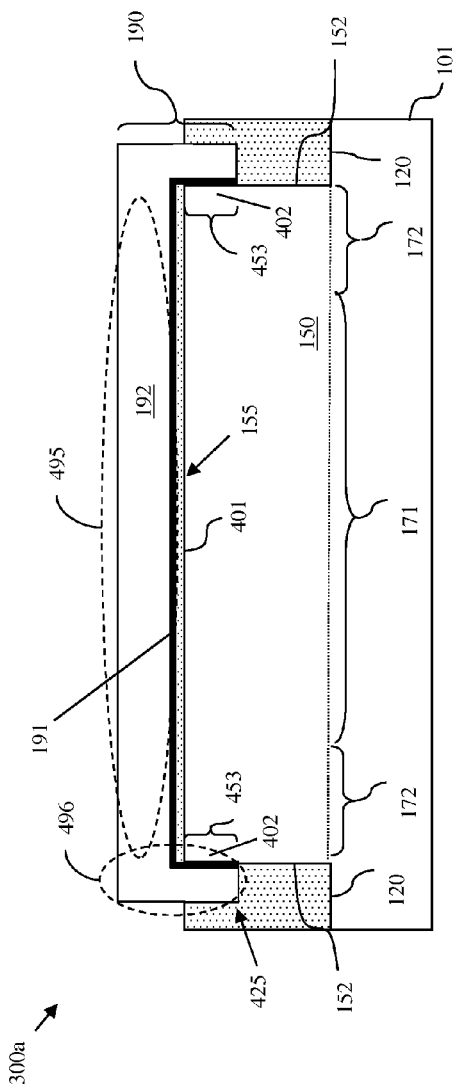
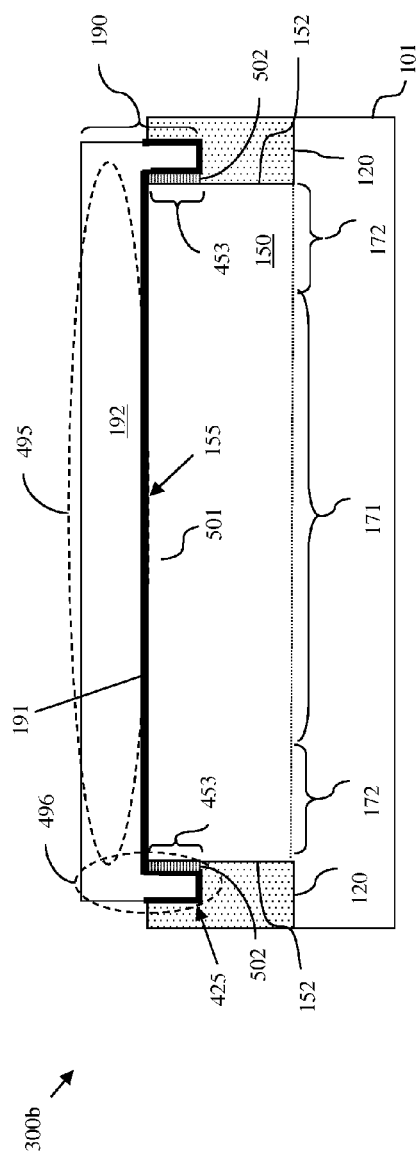
Figure 4
Figure 5

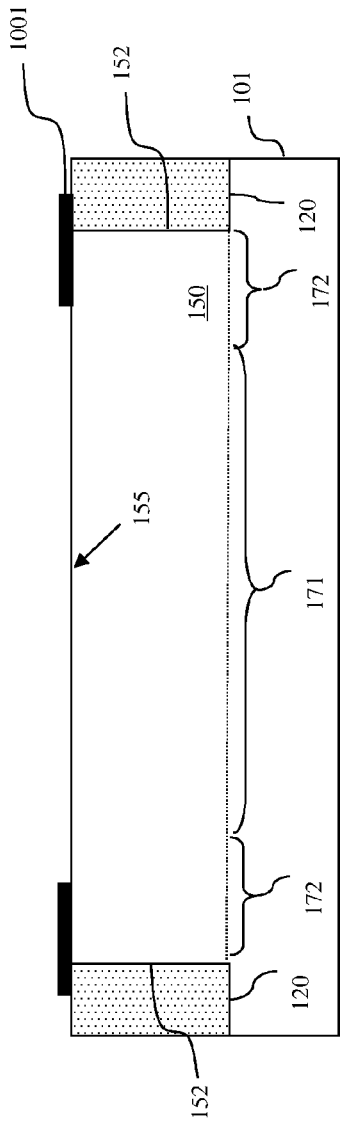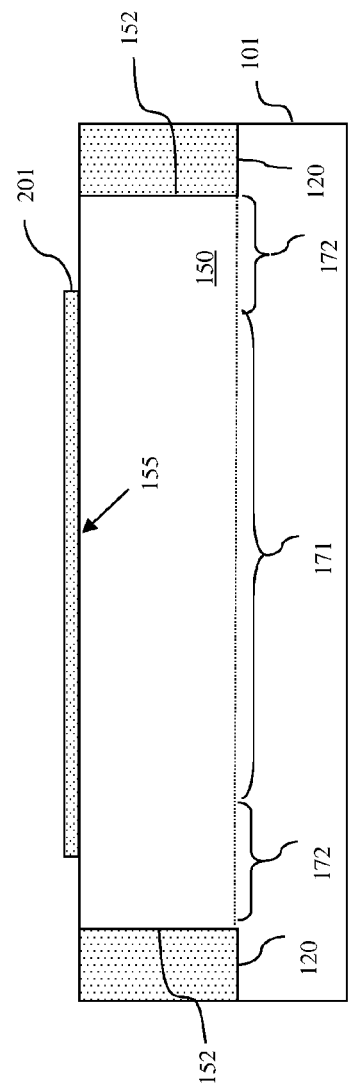

FIELD EFFECT TRANSISTOR WITH CHANNEL REGION HAVING PORTIONS WITH DIFFERENT BAND STRUCTURES FOR SUPPRESSED CORNER LEAKAGE

CROSS-REFERENCE TO RELATED APPLICATIONS

This application is a divisional of U.S. patent application Ser. No. 13/362,019, filed Jan. 31, 2012, issued as U.S. Pat. No. 8,350,343, which is a divisional of U.S. Pat. No. 8,125,037, issued Feb. 28, 2012, which is related to the U.S. Pat. No. 7,838,353, issued Nov. 23, 2010. The complete disclosures of these applications are incorporated herein by reference.

BACKGROUND

1. Field of the Invention

The embodiments of the invention generally relate to field effect transistors (FETs) and methods of forming these FETs with suppressed corner leakage, as a function of channel material band-edge modulation. Also disclosed are design structures for such field effect transistors.

2. Description of the Related Art

As complementary metal oxide semiconductor (CMOS) devices are scaled in size, conventional gate structures are being replaced by metal gate structures. Specifically, a conventional gate structure typically includes a thin silicon oxide ($SiO_2$) gate dielectric layer and a doped-polysilicon gate conductor layer. Unfortunately, doped polysilicon gate conductor layers are subject to depletion effects. These depletion effects result in an increase in the effective gate dielectric layer thickness and, thereby limit device scaling. Thus, high-k-dielectric-layer, metal-gate-conductor-layer stacks with different work functions for n-type field effect transistors (NFETs) and p-type field effect transistors, have been introduced. These stacks are improvements over the conventional gate structures in that the high k-dielectric layer minimizes leakage current and the metal gate conductor layer is not subject to depletion effects. However, with ever narrower channel widths new concerns for future CMOS technology generations and, more particularly, for CMOS technology generations at or beyond the 65 nm node, driven by narrow-channel effects (NCE), are introduced even with such high-k-dielectric-layer, metal-gate-conductor-layer stacks.

SUMMARY

In view of the foregoing, disclosed herein are embodiments of field effect transistors (FETs) having suppressed sub-threshold corner leakage, as a function of channel material band-edge modulation. Also disclosed are design structures for such FETs and method embodiments for forming such FETs.

One embodiment of a field effect transistor according to the present invention comprises a substrate. A semiconductor body is positioned on the substrate and has a top surface and opposing sidewalls. Isolation regions, typically in the form of trench isolation, are positioned laterally adjacent to the opposing sidewalls of the semiconductor body. The semiconductor body further comprises a channel region and a gate structure adjacent to the channel region. This gate structure extends laterally across the top surface of the semiconductor body (i.e., across the channel width) and onto the trench isolation regions. In order to suppress sub-threshold corner leakage at the interface between the channel region and the trench isolation regions, the band structure of the channel material is different at the channel width edges as compared to the central portion of the channel region. That is, the channel region has edge portions adjacent to the trench isolation regions. These edge portions have a first band structure. The channel region further has a central portion between the edge portions. This central portion has a second band structure that is selectively different from the first band structure.

Another embodiment of a field effect transistor according to the present invention comprises a substrate. A semiconductor body is positioned on the substrate and has a top surface and opposing sidewalls. Trench isolation regions are positioned laterally adjacent to the opposing sidewalls of the semiconductor body. As with the previously described embodiment, the semiconductor body further comprises a channel region and a gate structure adjacent to the channel region. In this embodiment, however, the trench isolation regions specifically comprise divots adjacent to the upper sections of the opposing sidewalls of the semiconductor body. Thus, in this embodiment, the gate structure comprises a horizontal portion extending laterally across the top surface of the semiconductor body and also a vertical portion extending into the divots adjacent to the upper sections of the opposing sidewalls. Again, in order to suppress sub-threshold corner leakage at the interface between the channel region and the trench isolation regions, the band structure of the channel material is different at the channel width edges as compared to the central portion of the channel region. That is, the channel region has edge portions adjacent to the trench isolation regions. Within the divots at the upper sections of the opposing sidewalls of the semiconductor body, these edge portions have a first band structure. The channel region further has a central portion between the edge portions. This central portion has a second band structure that is selectively different from the first band structure.

Also disclosed herein are embodiments of design structure for the above-mentioned field effect transistor embodiments. Each of these design structures can be embodied in a machine readable medium used in a design process, can reside on storage medium as a data format used for the exchange of layout data of integrated circuits. Furthermore, each of these design structures can comprise a netlist and can include test data, characterization data, verification data, and/or design specifications.

Also disclosed herein are method embodiments for forming the above described FET embodiments. Specifically, one embodiment of the method comprises providing a substrate. Trench isolation regions are formed in the substrate so as to define a semiconductor body with opposing sidewalls positioned laterally adjacent to the trench isolation regions. The area of the semiconductor body wherein a channel region will be formed is designated. This designated channel region has edge portions adjacent to the trench isolation regions and a central portion between the edge portions. Next, in order to ensure that sub-threshold corner leakage is suppressed, the top surface of the semiconductor body in either the central portion or the edge portions is altered such that the edge portions have a first band structure and the central portion has a second band structure different from the first band structure. Then, a gate structure is formed on the top surface of the semiconductor body adjacent to the designated channel region. Specifically, this gate structure is formed so that it extends laterally across the top surface of the semiconductor body (i.e., across the channel width) and onto the trench isolation regions.

Other embodiments of the method also comprises providing a substrate and then forming trench isolation regions in the substrate so as to define a semiconductor body with opposing sidewalls positioned laterally adjacent to the trench isolation regions. However, in these embodiments, the trench isolation regions are specifically formed with divots exposing the upper sections of the opposing sidewalls of the semiconductor body. Again, the area of the semiconductor body wherein a channel region will be formed is designated. This designated channel region has edge portions adjacent to the trench isolation regions and a central portion between the edge portions. Next, in order to ensure that sub-threshold corner leakage is suppressed, the upper sections of the opposing sidewalls in the designated channel region of the semiconductor body can be altered such that edge portions of the designated channel region have a first band structure and further such that a central portion of the designated channel region has a second band structure different from the first band structure. Alternatively, in order to ensure that sub-threshold corner leakage is suppressed, the top surface of the semiconductor body in the designated channel region can be altered such that edge portions of the designated channel region have a first band structure at the opposing sidewalls below the top surface and further such that a central portion of the designated channel region has a second band structure different from the first band structure.

BRIEF DESCRIPTION OF THE SEVERAL VIEWS OF THE DRAWINGS

The embodiments of the invention will be better understood from the following detailed description with reference to the drawings, which are not necessarily drawn to scale and in which:

FIG. 4 is a cross section diagram illustrating one configuration for a second embodiment of the field effect transistor of the present invention;

FIG. 5 is a cross section diagram illustrating another configuration for the second embodiment of the field effect transistor of the present invention;

FIG. 10 is a cross section diagram illustrating a partially completed field effect transistor formed according to the method of FIG. 7;

FIG. 11 is a cross section diagram illustrating a partially completed field effect transistor formed according to the method of FIG. 7;

DETAILED DESCRIPTION

The embodiments of the invention and the various features and advantageous details thereof are explained more fully with reference to the non-limiting embodiments that are illustrated in the accompanying drawings and detailed in the following description.

As mentioned above, with scaling of complementary metal oxide semiconductor (CMOS) devices, conventional gate structures are being replaced by metal gate structures. Specifically, a conventional gate structure typically includes a thin silicon oxide ($SiO_2$) gate dielectric layer and a doped-polysilicon gate conductor layer. Unfortunately, doped polysilicon gate conductor layers are subject to depletion effects. These depletion effects result in an increase in the effective gate dielectric layer thickness and, thereby limit device scaling. Thus, high-k-dielectric-layer, metal-gate-conductor-layer stacks with different work functions for n-type field effect transistors (NFETs) and p-type field effect transistors, have been introduced. These stacks are improvements over the conventional gate structures in that the high-k-dielectric layer minimizes leakage current and the metal gate conductor layer is not subject to depletion effects. However, with ever narrower channel widths new concerns for future CMOS technology generations and, more particularly, for CMOS technology generations at or beyond the 65 nm node are introduced even with such high-k-dielectric-layer, metal-gate-conductor-layer stacks.

In view of the foregoing, disclosed herein are embodiments of field effect transistors (FETs) having suppressed sub-threshold corner leakage, as a function of channel material band-edge modulation. Specifically, the FET channel region is formed with different materials at the edges as compared to the center. Different materials with different band structures and specific locations of those materials are selected in order to effectively raise the threshold voltage (Vt) at the edges of the channel region relative to the Vt at the center of the channel region and, thereby to suppress of sub-threshold corner leakage. Also disclosed are design structures for such FETs and method embodiments for forming such FETs.

Figure 1:
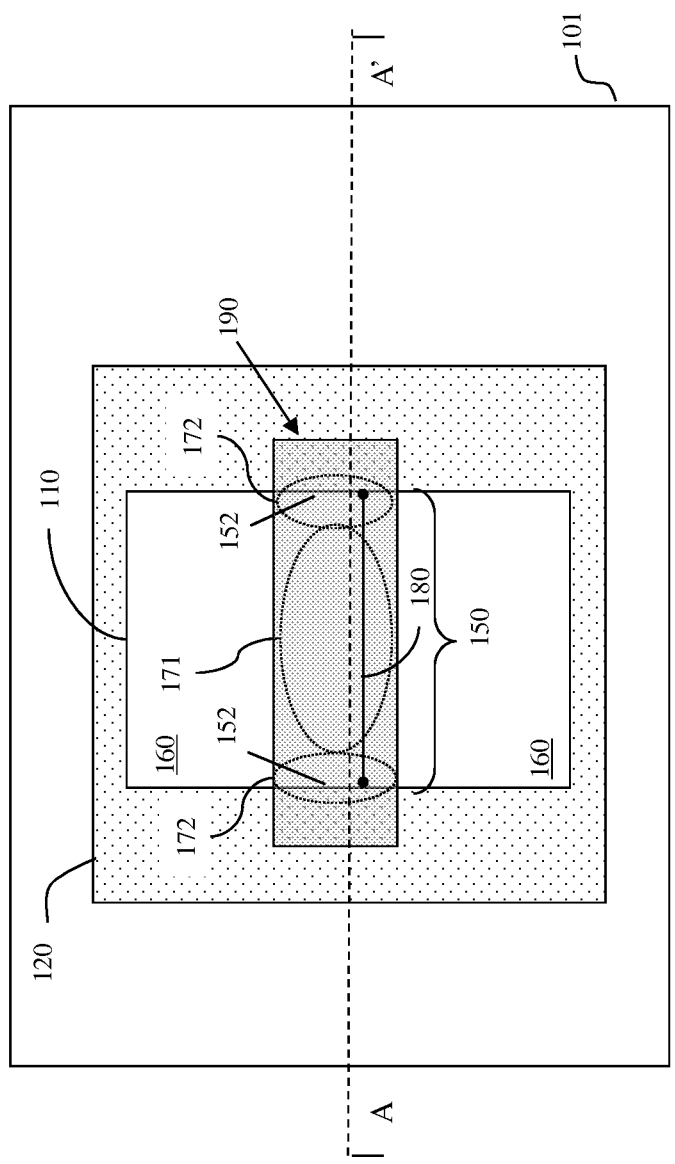
FIG. 1 is a top view diagram illustrating the embodiments of the field effect transistor of the present invention.

More particularly, referring to FIG. 1, each of the embodiments of the field effect transistor of the present invention comprises a substrate 101. The substrate 101 can, for example, comprise bulk single crystalline silicon wafer or silicon-on-insulator (SOI) wafer.

A semiconductor body 110 can be positioned on the substrate 101. Specifically, the semiconductor body 110 can, for example, be patterned from the top portion of a bulk silicon wafer (as illustrated) or from a single crystalline silicon layer above a buried oxide layer. This semiconductor body 110 can comprise source/drain regions 160 and a channel region 150 between the source/drain regions 160. The channel region 150 can have opposing sidewalls 152.

Trench isolation regions 120 can also be positioned on the substrate 101 so as to define the limits of the semiconductor body 110. Specifically, these trench isolation regions 120 can be positioned laterally immediately adjacent to the semiconductor body 110 and, more particularly, immediately adjacent to the opposing sidewalls 152 of the semiconductor body channel region 150. The trench isolation regions 120 can, for example, comprise shallow trench isolation (STI) regions filled with suitable isolation material(s) (e.g., $SiO_2$).

A gate structure 190 can be positioned adjacent to the channel region 150. The different embodiments of the field effect transistor of the present invention, as well as the various configurations thereof, vary with respect to the gate structure 190 and further vary with respect to the channel material in the center portion 171 of the channel region 150 as compared to the channel material in the channel width edge portions 172.

Figure 2:
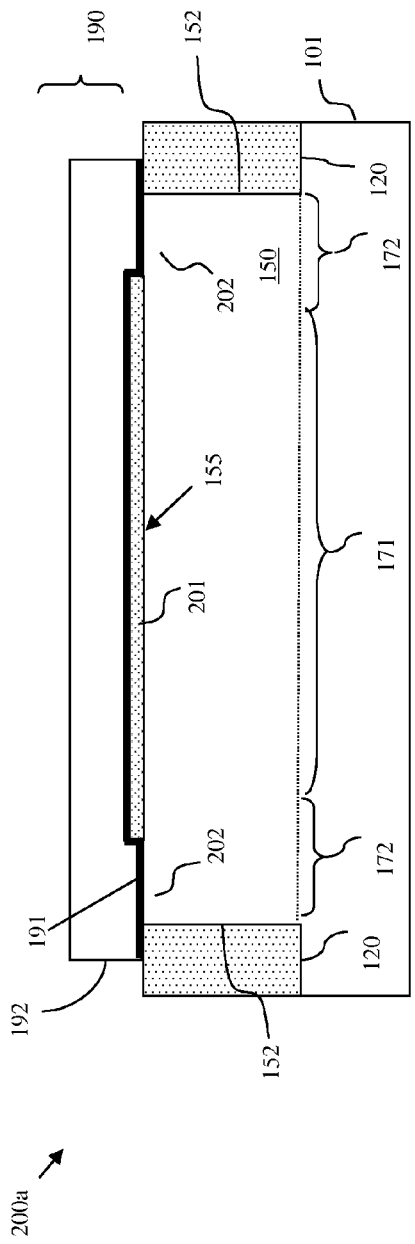
FIG. 2 is a cross section diagram illustrating one configuration for a first embodiment of the field effect transistor of the present invention.
Figure 3:
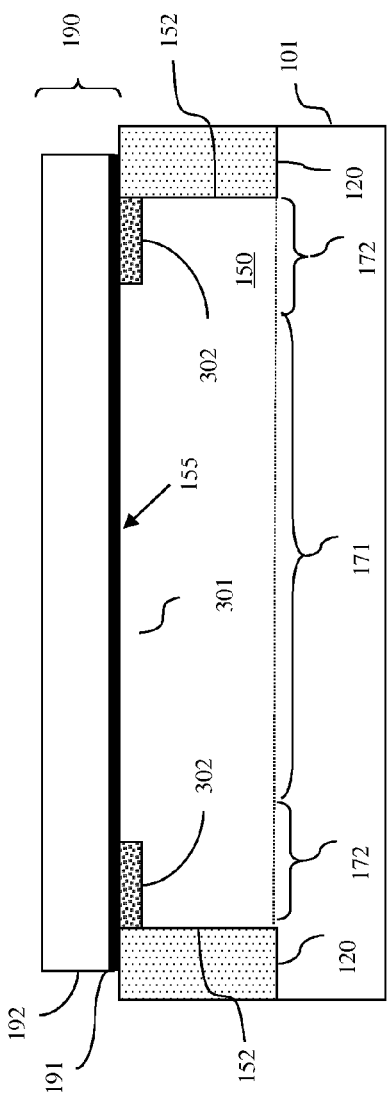
FIG. 3 is a cross section diagram illustrating another configuration for the first embodiment of the field effect transistor of the present invention.

FIGS. 2 and 3 illustrate different configurations 200a and 200b of one embodiment of the field effect transistor of the present invention. In each of these configurations 200a and 200b, the field effect transistor comprises a substrate 101. A semiconductor body 110 is positioned on the substrate 101 and has a top surface 155 and opposing sidewalls 152. Trench isolation regions 120 are positioned laterally adjacent to the opposing sidewalls 152 of the semiconductor body 110. The semiconductor body 110 further comprises a channel region 150 and a gate structure 190 adjacent to the channel region 150. This gate structure extends laterally across the top surface 155 of the semiconductor body 110 (i.e., across the channel width 180, see FIG. 1) and onto the trench isolation regions 120.

In order to suppress sub-threshold corner leakage at the interface between the channel region 150 and the trench isolation regions 120 (i.e., at the opposing sidewalls 152), the channel material and, thereby the band structure, is different in the channel width edge portions 172 as compared to the channel material in the central portion 171 of the channel region 150. That is, the channel region 150 has edge portions 172 adjacent to the trench isolation regions 120. These edge portions 172 have a first band structure. The channel region 150 further has a central portion 171 between the edge portions 172. This central portion 171 has a second band structure that is selectively different from the first band structure. The differences in band structures are a function of different semiconductor materials being used in the different portions 171, 172. The different materials with different band structures are selectively different so as to selectively adjust (i.e., modulate, vary, etc.) the threshold voltage (Vt) of the channel width edge portions 172 relative to the center portion 171 and, specifically, to suppress sub-threshold corner leakage at the channel width edge portions 172.

For example, referring to the configuration 200a of FIG. 2, the field effect transistor 200a can comprise a p-type filed effect transistor (PFET). Those skilled in the art will recognize that silicon germanium is often used in the channel region of a PFET because it has a band structure that effectively reduces the negative threshold voltage (Vt) of the PFET (i.e. to a less negative value of Vt) to an optimal level for device performance. However, in the configuration 200a, rather than having the entire top surface 155 of the channel region 150 comprise silicon germanium, only the top surface 155 in the center portion 171 of the channel region 150 comprises silicon germanium so that the center portion 171 and edge portions 172 of the channel region 150 have different band structures. More specifically, the top surface 155 of the semiconductor body 110 in the edge portions 172 of the channel region 150 adjacent to the gate structure 190 can comprise single crystalline silicon 202 such that the edge portions 172 have a first band structure associated with silicon. Only the top surface 155 in the central portion 171 of the PFET channel region 150 comprises silicon germanium (e.g., an epitaxial silicon germanium layer 201) such that it has a second band structure that is different from the first band structure of the channel width edge portions 172. In such a PFET, the band structure of silicon 202 raises the negative threshold voltage (to a more negative Vt) at the channel width edge portions 172 relative to the negative Vt of the central portion 171, thereby suppressing sub-threshold corner leakage. Additionally, in the case of a PFET, the gate structure 190 can comprise a gate dielectric layer 191 (e.g., a high-k gate dielectric layer or any other suitable gate dielectric material) adjacent to the top surface 155 of the semiconductor body 110 and extending laterally onto the trench isolation regions 120. The gate structure 190 can further comprise a suitable gate conductor layer 192 (e.g., a p-doped polysilicon gate conductor layer, a near valence band metal gate conductor layer or other suitable gate conductor layer) on the gate dielectric layer 191.

Alternatively, referring to the configuration 200b of FIG. 3, the field effect transistor 200b can comprise an n-type filed effect transistor (NFET). In the case of an NFET, the top surface 155 of the semiconductor body 110 in the edge portions 172 of the channel region 150 adjacent to the gate structure 190 can comprise a silicon carbide layer 302 such that the edge portions 172 have a first band structure associated with silicon carbide. However, the top surface 155 of the semiconductor body 110 in the central portion 171 of the channel region 150 adjacent to the gate structure 190 can comprise single crystalline silicon 301 such that the central portion 171 has a second band structure that is associated with silicon and, thereby, different from the first band structure. In such an NFET, the band structure of silicon carbide 302 raises the positive threshold voltage (Vt) at the channel width edge portions 172 relative the positive Vt of the central portion 171 and, thereby suppresses sub-threshold corner leakage. Additionally, in the case of an NFET, the gate structure 190 can comprise a gate dielectric layer 191 (e.g., a high-k gate dielectric layer or any other suitable gate dielectric material) adjacent to the top surface 155 of the semiconductor body 110 and extending laterally onto the trench isolation regions 120. The gate structure 190 can further comprise a suitable gate conductor layer 192 (e.g., an n-doped polysilicon gate conductor layer, a near conduction band metal gate conductor layer or other suitable gate conductor layer) on the gate dielectric layer 191.

FIGS. 4 and 5 illustrate different configurations 300a and 300b of another embodiment of the field effect transistor of the present invention. Each of these configurations 300a-300b comprises a substrate 101. A semiconductor body 110 is positioned on the substrate 101. The semiconductor body 110 has a top surface 155 and opposing sidewalls 152. Trench isolation regions 120 are positioned laterally adjacent to the opposing sidewalls 152 of the semiconductor body 110. As with the previously described embodiment illustrated in FIGS. 2 and 3, the semiconductor body 110 further comprises a channel region 150 and a gate structure 190 adjacent to the channel region 150.

In this embodiment, however, the trench isolation regions 120 specifically comprise divots 425 adjacent to the upper sections 453 of the opposing sidewalls 152 of the semiconductor body 110. Thus, in this embodiment, the gate structure 190 comprises a horizontal portion 495 extending laterally across the top surface 155 of the semiconductor body 110 and also a vertical portion 496 extending into the divots 425 adjacent to the upper sections 453 of the opposing sidewalls 152. As with the previously described embodiment, in order to suppress sub-threshold corner leakage at the interface between the channel region 150 and the trench isolation regions 120 (i.e., at the opposing sidewalls 152), the band structure of the channel material is different at the channel width edges 172 as compared to the central portion 171 of the channel region 150. However, this embodiment takes advantage of the vertical portion 496 of the gate structure 190, when positioning the different semiconductor materials with different band structures in the center 171 and edge 172 portions of the channel region 150.

For example, referring to the configuration 300a of FIG. 4, the field effect transistor 300a can comprise a p-type filed effect transistor (PFET). As mentioned above, those skilled in the art will recognize that silicon germanium can be used in the channel region of a PFET because it has a band structure that effectively reduces the negative threshold voltage (Vt) of the PFET to an optimal level for device performance. Thus, in the configuration 300a, the entire top surface 155 of the channel region 150 adjacent to the horizontal portion 495 of the gate structure 190 comprises a silicon germanium layer 401. However, in order to adjust the band structure of the channel width edge portions 172 relative to the central portion 171, the upper sections 453 of the opposing sidewalls 152 of the semiconductor body 110 below the silicon germanium top surface 155 and adjacent to the vertical portion 496 of the gate structure 190 can comprise single crystalline silicon 402. Thus, the edge portions 172 have a first band structure associated with silicon 402 and the central portion 171 has a second band structure that is selectively different from the first band structure (i.e., a second band structure associated with silicon germanium 401). In such a PFET, the band structure of silicon 402 raises the negative threshold voltage (Vt) at the channel width edge portions 172 relative to the negative Vt of the central portion 171, thereby suppressing sub-threshold corner leakage. Additionally, in the case of a PFET, the gate structure 190 can comprise a gate dielectric layer 191 (e.g., a high-k gate dielectric layer or any other suitable gate dielectric material) adjacent to the top surface 155 of the semiconductor body 110 (i.e., adjacent to the silicon germanium layer 401) and extending vertically into the divots 425 along the upper sections 453 of the opposing sidewalls 152 (i.e., adjacent to the silicon 402). The gate structure 190 can further comprise a suitable gate conductor layer 192 (e.g., a p-doped polysilicon gate conductor layer, a near valence band metal gate conductor layer or other suitable gate conductor layer) on the gate dielectric layer 191.

Referring to the configuration 300b of FIG. 5, the field effect transistor 300b can comprise an n-type field effect transistor (NFET). In the case of an NFET, the top surface 155 of the semiconductor body 110 can comprise single crystalline silicon 501, whereas the upper sections 453 of the opposing sidewalls 152 can comprise a silicon carbide layer 502. Thus, the channel width edge portions 172 have a first band structure associated with silicon carbide 502 and the central portion 171 of the channel region 150 has a second band structure different from the first band structure (i.e., a second band structure associated with silicon 501). In such an NFET, the band structure of silicon carbide 502 raises the positive threshold voltage (Vt) at the channel width edge portions 172 relative to the positive Vt of the central portion 171 and, thereby suppresses sub-threshold corner leakage. Additionally, in the case of an NFET, the gate structure 190 can comprise a gate dielectric layer 191 (e.g., a high-k gate dielec-tric layer or any other suitable gate dielectric material) adjacent to the top surface 155 of the semiconductor body 110 (i.e., adjacent to the silicon 501) and extending vertically into the divots 425 along the upper sections 453 of the opposing sidewalls 152 (i.e., adjacent to the silicon carbide layer 502). The gate structure 190 can further comprise a suitable gate conductor layer 192 (e.g., an n-doped polysilicon gate conductor layer, a near conduction band metal gate conductor layer or other suitable gate conductor layer) on the gate dielectric layer 191.

Also disclosed herein are embodiments of design structure for the above-mentioned field effect transistor embodiments and various configurations thereof as illustrated in FIGS. 1-5. Each of these design structures can be embodied in a machine readable medium used in a design process, can reside on storage medium as a data format used for the exchange of layout data of integrated circuits. Furthermore, each of these design structures can comprise a netlist and can include test data, characterization data, verification data, and/or design specifications.

Figure 6:
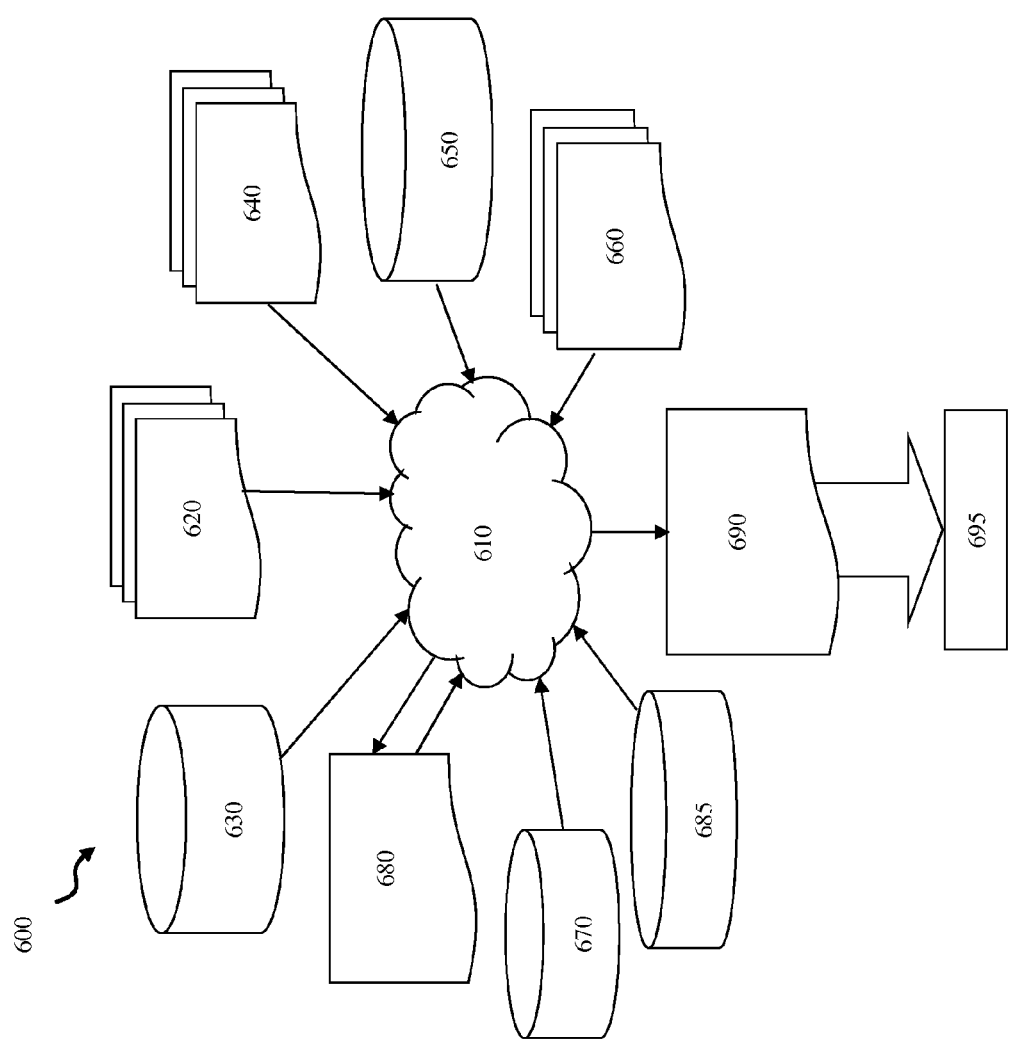
FIG. 6 is a flow diagram of a design process used in semiconductor design, manufacture, and/or test.

Specifically, FIG. 6 shows a block diagram of an exemplary design flow 600 used for example, in semiconductor design, manufacturing, and/or test. Design flow 600 may vary depending on the type of IC being designed. For example, a design flow 600 for building an application specific IC (ASIC) may differ from a design flow 600 for designing a standard component. Design structure 620 is preferably an input to a design process 610 and may come from an IP provider, a core developer, or other design company or may be generated by the operator of the design flow, or from other sources. Design structure 620 comprises an embodiment of the invention as shown in FIGS. 1-5 in the form of schematics or HDL, a hardware-description language (e.g., Verilog, VHDL, C, etc.). Design structure 620 may be contained on one or more machine readable medium. For example, design structure 620 may be a text file or a graphical representation of an embodiment of the invention as shown in FIGS. 1-5.

Design process 610 preferably synthesizes (or translates) an embodiment of the invention as shown in FIGS. 1-5 into a netlist 680, where netlist 680 is, for example, a list of wires, transistors, logic gates, control circuits, I/O, models, etc. that describes the connections to other elements and circuits in an integrated circuit design and recorded on at least one of machine readable medium. This may be an iterative process in which netlist 680 is resynthesized one or more times depending on design specifications and parameters for the circuit.

Design process 610 may include using a variety of inputs; for example, inputs from library elements 630 which may house a set of commonly used elements, circuits, and devices, including models, layouts, and symbolic representations, for a given manufacturing technology (e.g., different technology nodes, 32 nm, 45 nm, 90 nm, etc.), design specifications 640, characterization data 650, verification data 660, design rules 670, and test data files 685 (which may include test patterns and other testing information).

Design process 610 may further include, for example, standard circuit design processes such as timing analysis, verification, design rule checking, place and route operations, etc. One of ordinary skill in the art of integrated circuit design can appreciate the extent of possible electronic design automation tools and applications used in design process 610 without deviating from the scope and spirit of the invention. The design structure of the invention is not limited to any specific design flow.

Design process 610 preferably translates an embodiment of the invention as shown in FIGS. 1-5, along with any additional integrated circuit design or data (if applicable), into a second design structure 690. Design structure 690 resides on a storage medium in a data format used for the exchange of layout data of integrated circuits (e.g. information stored in a GDSII (GDS2), GL1, OASIS, or any other suitable format for storing such design structures). Design structure 690 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1-5. Design structure 690 may then proceed to a stage 695 where, for example, design structure 690: proceeds to tape-out, is released to manufacturing, is released to a mask house, is sent to another design house, is sent back to the customer, etc.

Figure 7:
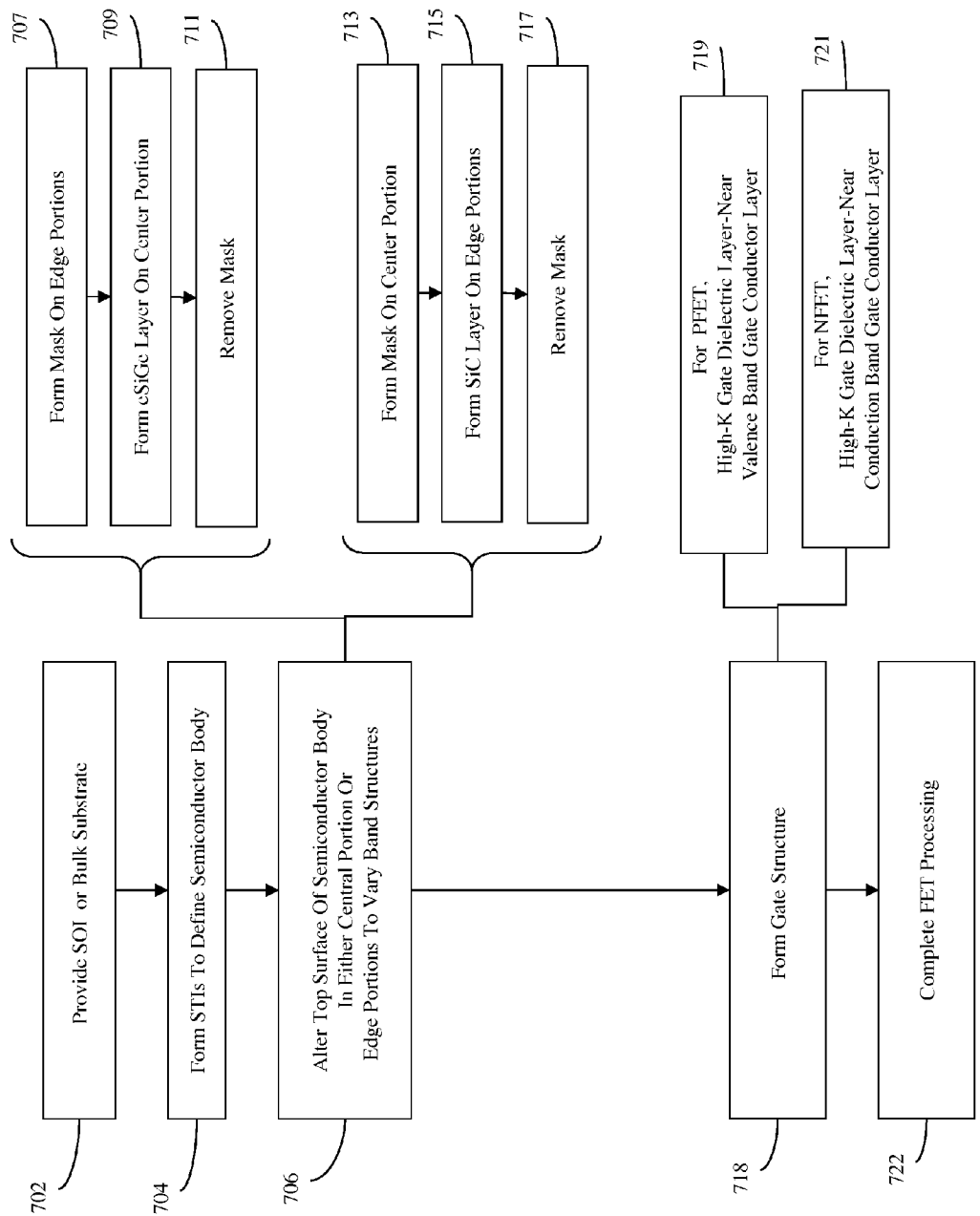
FIG. 7 is a flow diagram illustrating a method of forming the field effect transistors of FIGS. 2 and 3.
Figure 8:
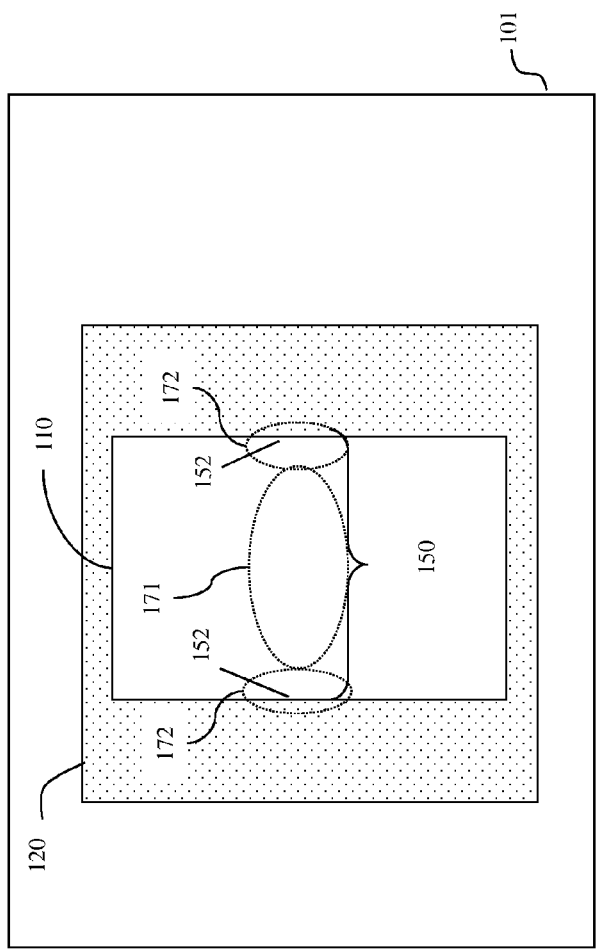
FIG. 8 is a cross section diagram illustrating a partially completed field effect transistor formed according to the method of FIG. 7.
Figure 9:
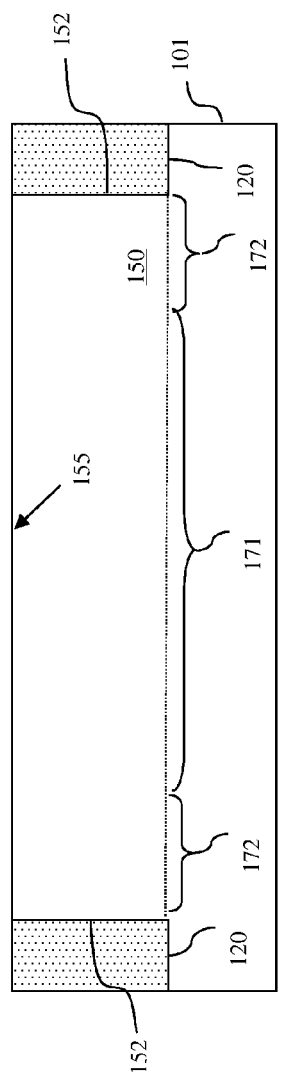
FIG. 9 is a cross section diagram illustrating a partially completed field effect transistor formed according to the method of FIG. 7.

Also disclosed herein are method embodiments for forming the above described FET embodiments. Specifically, referring to the flow diagram of FIG. 7, one embodiment of the method comprises providing a substrate 101, such as a bulk single crystalline silicon wafer or a silicon-on-insulator (SOI) wafer (702). Then, trench isolation regions 120 are formed in the substrate 101 (e.g., using conventional STI processing techniques) so as to define a semiconductor body 110 with opposing sidewalls 152 positioned laterally adjacent to the trench isolation regions 120 (704, see FIGS. 8 and 9 in combination). The area of the semiconductor body 110 wherein a channel region 150 will be formed is designated. This designated channel region 150 has edge portions 172 adjacent to the trench isolation regions 120 and a central portion 171 between the edge portions 172.

Next, in order to ensure that sub-threshold corner leakage is suppressed, the top surface 155 of the semiconductor body 110 in either the central portion 171 or the edge portions 172 is altered such that the edge portions 172 have a first band structure and the central portion has a second band structure different from the first band structure (706). Specifically, this altering is performed so that the first band structure and the second band structure are selectively different in order to selectively adjust a threshold voltage (Vt) of the edge portions 172 of the channel region 150 relative to the Vt of the center portion 171 of the channel region 150 in order to suppress sub-threshold corner leakage at the edge portions 172.

For example, for a p-type field effect transistor, a mask 1001 can be formed on the top surface 155 of the semiconductor body 110 above the edge portions 172 so as to expose the central portion 171 (707, see FIG. 10). Formation of the mask 1001 can be accomplished, for example, by oxidizing the top surface 155 of the semiconductor body 110. Next, a resist layer can be deposited and patterned over the edge portions 172, exposing the oxidized top surface in the center portion 171. Then, a wet etch process can be performed in order to remove the oxide from the exposed central portion 171. Once the wet etch process is performed, the patterned resist layer can be removed, leaving the remaining oxidized surface on the edge portions 172 of the semiconductor body 110 to function as the mask 1001. After the mask 1001 is formed, a silicon germanium layer 201 can be formed (e.g., using conventional epitaxial deposition processes) on the exposed silicon in the central portion 171 of the channel region 150 of the semiconductor body 110 and the mask 1001 can be removed (709-711, see FIG. 11).

Figure 12:
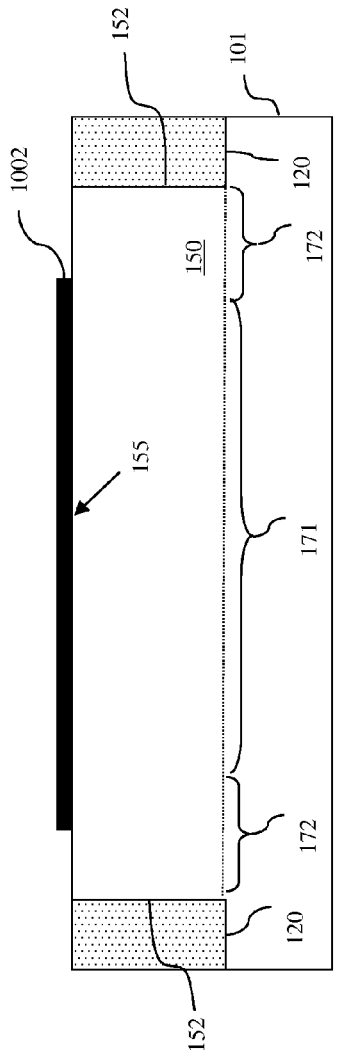
FIG. 12 is a cross section diagram illustrating a partially completed field effect transistor formed according to the method of FIG. 7.
Figure 13:
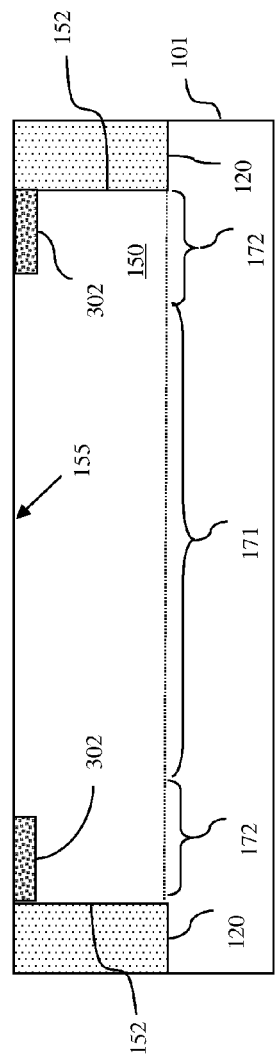
FIG. 13 is a cross section diagram illustrating a partially completed field effect transistor formed according to the method of FIG. 7.

Alternatively, for an n-type field effect transistor, a mask 1002 can be formed on the on the top surface 155 of the semiconductor body 110 above the central portion 172 so as to expose the edge portions 171 (713, see FIG. 12). Next, a silicon carbide layer 302 can be formed on the exposed edge portions 172 of the semiconductor body 110 (e.g., by performing a shallow carbon implant process) (715, see FIG. 13). Once the silicon carbide layer 302 is formed, the mask 1002 can be removed and thermal annealing performed to incorporate the carbon into the silicon crystal lattice (717, see FIG. 13).

Following the altering process 706, a gate structure 190 can be formed adjacent to the designated channel region 150 and extending laterally onto the trench isolation regions 120 (718-721, see FIGS. 2 and 3). This gate structure 190 can be formed by depositing a thin gate dielectric layer 191 (e.g., a high-k gate dielectric layer or any other suitable gate dielectric material) adjacent to the top surface 155 of the semiconductor body 110 and trench isolation regions 120. Following gate dielectric layer 191 formation, a gate conductor layer 192 can be formed on the gate dielectric layer 191 to create a gate stack. In the case of a PFET, a p-doped polysilicon gate conductor layer, a near valence band metal gate conductor layer or any other suitable gate conductor layer can be used. In the case of an NFET, an n-doped polysilicon gate conductor layer, a near conduction band metal gate conductor layer or any other suitable gate conductor layer can be used. The resulting stack 191-192 can be patterned and etched to form a gate structure 190 on the top surface 155 of the designated channel region 150 and extending laterally above at least a portion of the trench isolation regions 120.

After completion of the gate structure 190, additional processing is performed in order to complete the FET structures (722). This additional processing includes, but is not limited to, halo implantation, source/drain extension implantation, gate sidewall spacer formation, source/drain implantation, silicide formation, interlayer dielectric deposition, contact formation, etc.

Figure 14:
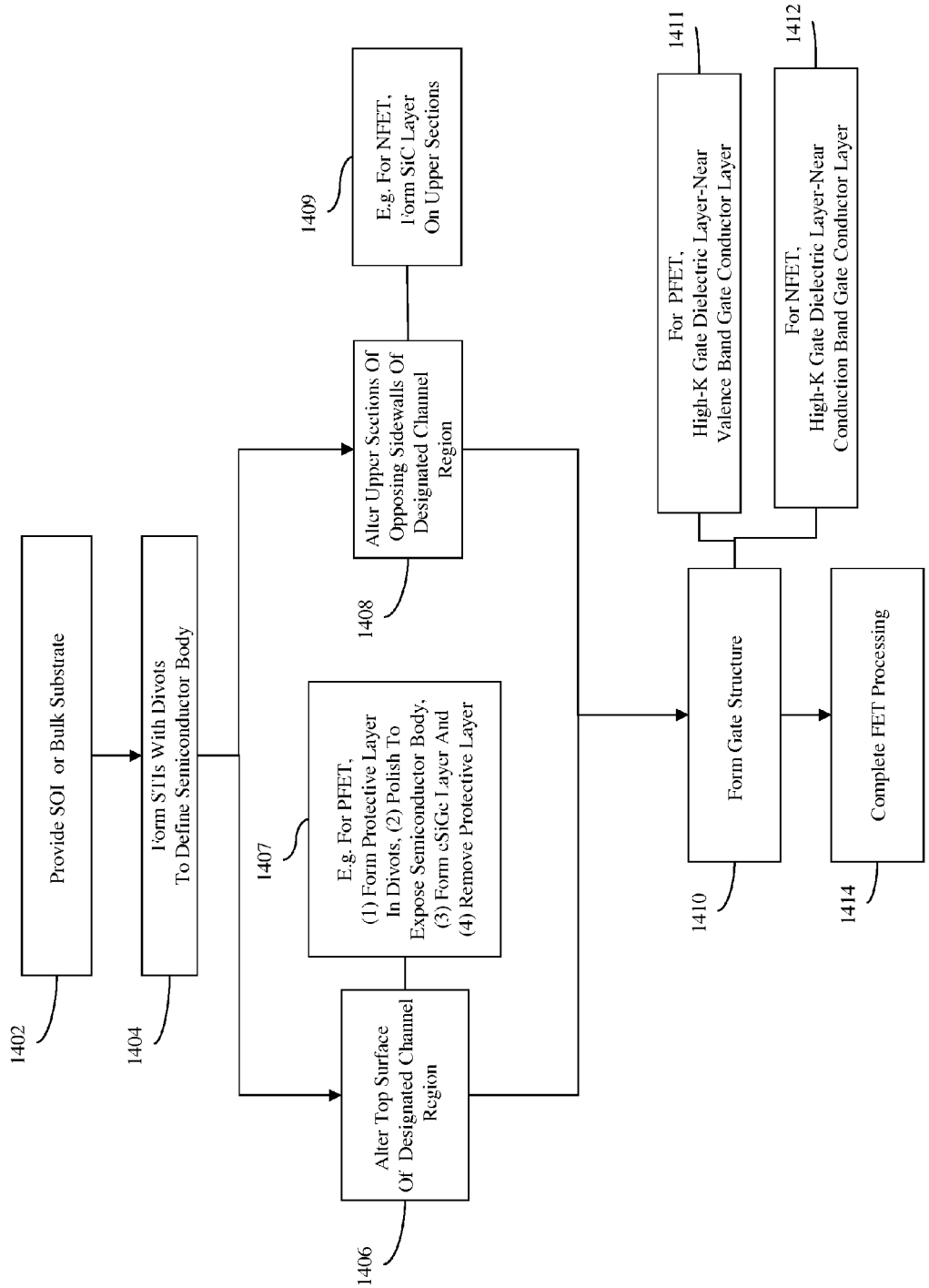
FIG. 14 is a flow diagram illustrating a method of forming the field effect transistors of FIGS. 4 and 5.
Figure 15:
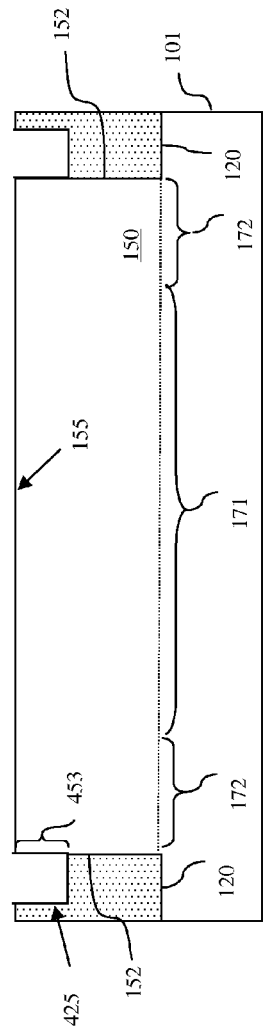
FIG. 15 is a cross section diagram illustrating a partially completed field effect transistor formed according to the method of FIG. 14.

Referring to the flow diagram of FIG. 14, other embodiments of the method also comprise providing a substrate 101, such as a bulk single crystalline silicon wafer or silicon-on-insulator (SOI) wafer (1402). Then, trench isolation regions 120 are formed in the substrate 101 (e.g., using conventional STI processing techniques) so as to define a semiconductor body 110 with opposing sidewalls 152 positioned laterally adjacent to the trench isolation regions 120 (1404). However, in these embodiments, the trench isolation regions 120 are specifically formed with divots 425 that expose the upper sections 453 of the opposing sidewalls 152 of the semiconductor body 110 (see FIG. 15). Techniques that allow for such divot 425 formation in STIs 120 are well-known in the art. For example, divots can be formed during shallow trench isolation formation by providing a $SiO_2$ film on the silicon wafer, with a $Si_3N_4$ film above, patterning and etching trenches through both films and at least part way into the silicon, filling the trenches with $SiO_2$ by CVD deposition and CMP/etch-back to the top of the remaining $Si_3N_4$ film. The remaining $Si_3N_4$ films are selectively removed, and some of the exposed $SiO_2$ trench fill is etched back isotropically. This isotropic etching will result in a divot adjacent to the silicon islands. Again, the area of the semiconductor body 110 wherein a channel region 150 will be formed is designated. This designated channel region 150 has edge portions 172 adjacent to the trench isolation regions 120 and a central portion 171 between the edge portions 172.

Next, in order to ensure that sub-threshold corner leakage is suppressed, the top surface 155 of the semiconductor body 110 in the designated channel region 150 can be altered such that edge portions 172 of the designated channel region 150 have a first band structure at the opposing sidewalls 152 below the top surface 155 and further such that a central portion 171 of the designated channel region 150 has a second band structure different from the first band structure (1406-1407).

Figure 16:
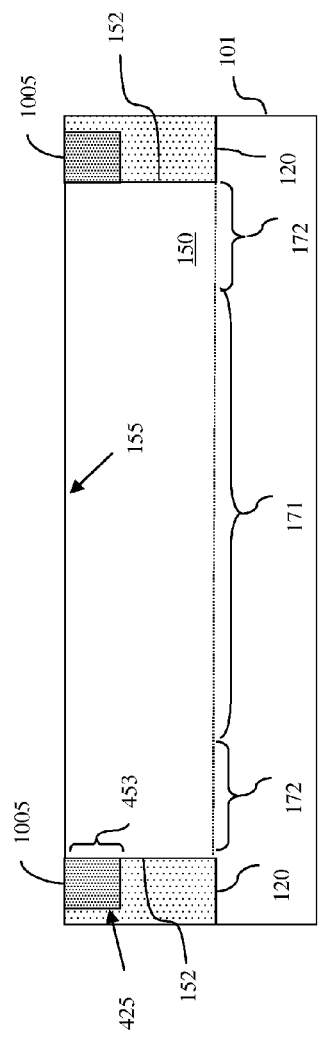
FIG. 16 is a cross section diagram illustrating a partially completed field effect transistor formed according to the method of FIG. 14.
Figure 17:
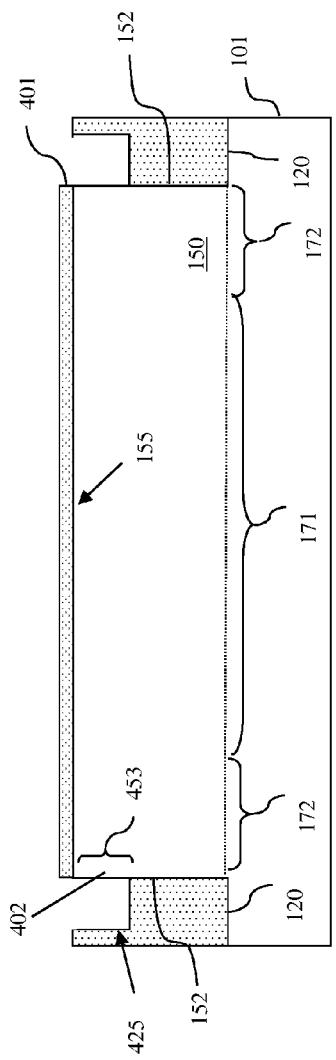
FIG. 17 is a cross section diagram illustrating a partially completed field effect transistor formed according to the method of FIG. 14.
Figure 18:
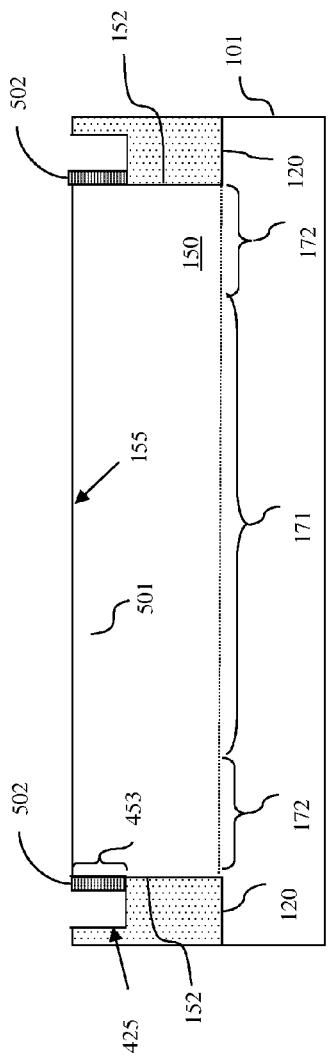
FIG. 18 is a cross section diagram illustrating a partially completed field effect transistor formed according to the method of FIG. 14.

For example, in the case of a PFET, the divots 425 can be filled with a protective layer 1005 (E.g., boron nitride) in order to protect the upper sections 453 of the opposing sidewalls 152. Then, a polishing process (e.g., chemical mechanical polishing (CMP)) can be performed so as to expose the semiconductor body 110 (see FIG. 16). Once the semiconductor body 110 is exposed, a silicon germanium layer 401 can be formed (e.g., by a conventional epitaxial deposition process) on the top surface 115 of the semiconductor body 110 and the protective layer 1005 can be removed from the divots 425 (e.g., by performing a selective etch process) (see FIG. 17). Thus, the edge portions 172 of the designated channel region 150 have a first band structure associated with silicon 402 at the opposing sidewalls 152 below the silicon germanium 401 on the top surface 155 and the central portion 171 of the designated channel region 150 has a second band structure associated with silicon germanium 401 (i.e., the first band structure in the edge portions 172 and the second band structure in the center portion 171 are different).

Alternatively, in order to ensure that sub-threshold corner leakage is suppressed, the upper sections 453 of the opposing sidewalls 152 in the designated channel region 150 of the semiconductor body 110 can be altered such that edge portions 172 of the designated channel region 150 have a first band structure and further such that the central portion 171 of the designated channel region 150 has a second band structure different from the first band structure (1408-1409).

For example, in the case of an NFET, after the trench isolation regions 120 are formed with divots 425 exposing the upper sections 453 of the opposing sidewalls 152 of the semiconductor body 110, a silicon carbide layer 502 can be formed within the divots 425 on the upper sections 453 of the opposing sidewalls 152. Thus, the edge portions 172 of the designated channel region 150 have a first band structure associated with the silicon carbide 502 on the upper sections 453 of the opposing sidewalls 152 and the central portion 171 of the designated channel region 150 has a second band structure associated with silicon 501 at the top surface 155 (i.e., the first band structure in the edge portions 172 and the second band structure in the center portion 171 are different).

Consequently, be it the top surface 155 of the semiconductor body 110 or the upper sections 453 of the opposing sidewalls 152 of the semiconductor body 110 being altered, the altering process is performed such that the first band structure of the edge portions 172 and the second band structure of the central portion 171 are selectively different in order to selectively adjust a threshold voltage (Vt) of the edge portions 172 of the channel region 150 relative to the Vt of the central portion 171 of the channel region 150 and, thereby to suppress sub-threshold corner leakage at the edge portions 172.

Following the altering processes 1406 or 1408, a gate structure 190 can be formed adjacent to the designated channel region 150 (1410). Specifically, a gate structure 190 can be formed with a horizontal portion 495 above the top surface 155 of the designated channel region and a vertical portion 496 extending into the divots 425 along the upper sections 453 of the opposing sidewalls 152 (1410-1412, see FIGS. 4 and 5). This gate structure 190 can be formed by depositing a thin conformal gate dielectric layer 191 (e.g., a high-k gate dielectric layer or any other suitable gate dielectric material) above the top surface 155 of the semiconductor body 110 and within the divots 425 adjacent to the upper sections 453 of the opposing sidewalls 152. Following gate dielectric layer 191 formation, a gate conductor layer 192 can be formed on the gate dielectric layer 191 to create a gate stack. In the case of a PFET, a p-doped polysilicon gate conductor layer, a near valence band metal gate conductor layer or any other suitable gate conductor layer can be used. In the case of an NFET, an n-doped polysilicon gate conductor layer, a near conduction band metal gate conductor layer or any other suitable gate conductor layer can be used. The resulting stack 191-192 can be patterned and etched to form a gate structure 190 above the top surface 155 of the designated channel region 150 and extending vertically into the divots 425 adjacent to the upper sections 453 of the opposing sidewalls 152.

After completion of the gate structure 190, additional processing is performed in order to complete the FET structures (1414). This additional processing includes, but is not limited to, halo implantation, source/drain extension implantation, gate sidewall spacer formation, source/drain implantation, silicide formation, interlayer dielectric deposition, contact formation, etc.

It should be understood that for each of the transistor, design structure and method embodiments, described in detail above, high-k dielectric materials comprise dielectric materials having a dielectric constant "k" above 3.9 (i.e., above the dielectric constant of $SiO_2$). Exemplary high-k dielectric materials that can be incorporated into the disclosed embodiments include, but are not limited to, hafnium-based materials (e.g., $HfO_2$, HfSiO, HfSiON, or HfAlO) or some other suitable high-k dielectric material (e.g., $Al_2O_3$, $TaO_5$, $ZrO_5$, etc.). Exemplary near valence band metal gate conductor materials that can be incorporated into the disclosed PFET embodiments can include, but are not limited to, rhenium, rhenium oxide, platinum, ruthenium, ruthenium oxide, nickel, palladium, iridium, etc. or suitable alloys thereof. Finally, exemplary near conduction band metals that can be incorporated into the disclosed NFET embodiments can include, but are not limited to, titanium nitride, titanium silicon nitride, tantalum nitride, tantalum silicon nitride, aluminum, silver, hafnium, etc.

It should be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

Therefore, disclosed above are embodiments of field effect transistors (FETs) having suppressed sub-threshold corner leakage, as a function of channel material band-edge modulation. Specifically, the FET channel region is formed with different materials at the edges as compared to the center. Different materials with different band structures and specific locations of those materials are selected in order to effectively raise the threshold voltage (Vt) at the edges of the channel region relative to the Vt at the center of the channel region and, thereby to suppress of sub-threshold corner leakage. Also disclosed are design structures for such FETs and method embodiments for forming such FETs.

Benefits which flow from the above invention include circuits and products with reduced power consumption, both in standby mode and active mode, circuits with greater tolerance to low power-supply voltage, and higher speed circuits due to the ability to lower threshold voltage while maintaining low leakage currents. Furthermore increased density and thus decreased manufacturing costs can follow by using physically narrower (smaller) transistors while achieving a given level of performance compared to the prior art.

What is claimed is:

1. A field effect transistor comprising:
a substrate;
a semiconductor body on said substrate and having a top surface and opposing sidewalls; and
isolation regions positioned laterally adjacent to said opposing sidewalls; and
a gate structure on said top surface of said semiconductor body and extending laterally across said opposing sidewalls onto said isolation regions, said semiconductor body further comprising a channel region aligned below said gate structure, extending laterally between said opposing sidewalls and comprising:
a center portion at said top surface; and
edge portions at said top surface and extending laterally from said center portion to said opposing sidewalls such that said edge portions are immediately adjacent to said isolation regions and said gate structure,
said edge portions comprising a first band structure, and said center portion comprising a second band structure different from said first band structure.

2. The field effect transistor of claim 1, said first band structure and said second band structure being selectively different so as to selectively adjust a threshold voltage of said field effect transistor.

3. The field effect transistor of claim 1, said first band structure and said second band structure being selectively different so that said first band structure suppresses sub-threshold corner leakage at said edge portions.

4. The field effect transistor of claim 1, said semiconductor body further comprising source/drain regions, said edge portions and said center portion of said channel region being positioned laterally between said source/drain regions.

5. The field effect transistor of claim 4,
said top surface of said semiconductor body in said edge portions of said channel region adjacent to said gate structure comprising silicon such that said edge portions have said first band structure, and
said top surface of said semiconductor body in said center portion of said channel region adjacent to said gate structure comprising a silicon germanium layer such that said center portion has said second band structure different from said first band structure.

6. The field effect transistor of claim 5, said field effect transistor comprising a p-type field effect transistor and said gate structure comprising a high-k gate dielectric layer and a near valence band metal gate conductor layer on said high-k gate dielectric layer.

7. The field effect transistor of claim 4,
said top surface of said semiconductor body in said edge portions of said channel region adjacent to said gate structure comprising a silicon carbide layer such that said edge portions have said first band structure, and
said top surface of said semiconductor body in said center portion of said channel region adjacent to said gate structure comprising silicon such that said center portion has said second band structure different from said first band structure.

8. The field effect transistor of claim 7, said field effect transistor comprising an n-type field effect transistor and said gate structure comprising a high-k gate dielectric layer and a near conduction band metal gate conductor layer on said high-k gate dielectric layer.

9. A field effect transistor comprising:
a substrate;
a silicon body on said substrate and having a top surface and opposing sidewalls;
isolation regions positioned laterally adjacent to said opposing sidewalls;
a gate structure on said top surface of said silicon body and extending laterally across said opposing sidewalls onto said isolation regions, said silicon body further comprising a channel region aligned below said gate structure, extending laterally between said opposing sidewalls and comprising:
a center portion at said top surface; and,
edge portions at said top surface and extending laterally from said center portion to said opposing sidewalls such that said edge portions are immediately adjacent to said isolation regions and said gate structure; and
a silicon germanium layer stacked between said gate structure and said center portion of said channel region at said top surface of said silicon body, said silicon germanium layer being essentially centered on and shorter in length than said silicon body such that said edge portions of said channel region comprise silicon only and have a first band structure and such that said center portion of said channel region comprises silicon germanium on silicon and has a second band structure different from said first band structure.

10. The field effect transistor of claim 9, said first band structure and said second band structure being selectively different so as to selectively adjust a threshold voltage of said field effect transistor.

11. The field effect transistor of claim 9, said first band structure and said second band structure being selectively different so that said first band structure suppresses sub-threshold corner leakage at said edge portions.

12. The field effect transistor of claim 9, said field effect transistor comprising a p-type field effect transistor and said gate structure comprising a high-k gate dielectric layer and a near valence band metal gate conductor layer on said high-k gate dielectric layer.

13. The field effect transistor of claim 9, said field effect transistor comprising a p-type field effect transistor and said gate structure comprising a gate dielectric layer and a P-doped polysilicon gate conductor layer on said gate dielectric layer.

14. The field effect transistor of claim 9, said silicon germanium layer comprising an epitaxial silicon germanium layer.

15. The field effect transistor of claim 9, said silicon body further comprising source/drain regions, said edge portions and said center portion of said channel region being positioned laterally between said source/drain regions.

16. A field effect transistor comprising:
   a substrate;
   a silicon body on said substrate and having a top surface and opposing sidewalls; and
   isolation regions positioned laterally adjacent to said opposing sidewalls; and
   a gate structure on said top surface of said silicon body and extending laterally across said opposing sidewalls onto said isolation regions, said silicon body further comprising a channel region aligned below said gate structure, extending laterally between said opposing sidewalls and comprising:
      a center portion at said top surface; and
      edge portions at said top surface and extending laterally from said center portion to said opposing sidewalls such that said edge portions are immediately adjacent to said isolation regions and said gate structure,
      said edge portions being carbon-doped so as to comprise a first band structure, and
      said center portion comprising a second band structure different from said first band structure.

17. The field effect transistor of claim 16, said first band structure and said second band structure being selectively different so that said first band structure suppresses sub-threshold corner leakage at said edge portions.

18. The field effect transistor of claim 16, said silicon body further comprising source/drain regions, said edge portions and said center portion of said channel region being positioned laterally between said source/drain regions.

19. The field effect transistor of claim 16, said field effect transistor comprising an n-type field effect transistor and said gate structure comprising a high-k gate dielectric layer and a near conduction band metal gate conductor layer on said high-k gate dielectric layer.

* * * * *